United States Patent [19]
Austin et al.

[11] Patent Number: 5,640,081
[45] Date of Patent: Jun. 17, 1997

[54] METHOD AND APPARATUS FOR MONITORING DISCHARGE OF A BATTERY DEVICE BASED ON BATTERY SELF-DISCHARGE AND DISCHARGE OVER TIME

[75] Inventors: Steven E. Austin, Fremont; James J. Blanc, San Mateo; David B. Townsley, Cupertino; Stephen J. Kim, San Jose, all of Calif.

[73] Assignee: Apple Computer, Inc., Cupertino, Calif.

[21] Appl. No.: 242,319

[22] Filed: May 13, 1994

[51] Int. Cl.$^6$ ........................... H02J 7/00
[52] U.S. Cl. ........................... 320/48; 324/426
[58] Field of Search ........................... 320/2, 43, 48, 320/13, 19, 28, 31, 35; 331/111, 113, 143

[56] References Cited

U.S. PATENT DOCUMENTS

| | | | |
|---|---|---|---|
| 3,395,362 | 7/1968 | Sutherland | 331/57 |
| 4,414,515 | 11/1983 | Suzuki et al. | 331/111 |
| 4,709,202 | 11/1987 | Koenck et al. | 320/43 |
| 4,866,471 | 9/1989 | Ikuta | 354/468 |
| 5,121,047 | 6/1992 | Goedken et al. | 320/39 |
| 5,191,277 | 3/1993 | Ishikura et al. | 320/22 |
| 5,248,929 | 9/1993 | Burke | 320/48 |
| 5,268,845 | 12/1993 | Startup et al. | 364/483 |
| 5,296,997 | 3/1994 | Betton et al. | 361/92 |
| 5,314,228 | 5/1994 | Hess et al. | 320/31 |
| 5,422,560 | 6/1995 | Yan | 320/31 |
| 5,445,499 | 8/1995 | Uskali et al. | 320/43 |

FOREIGN PATENT DOCUMENTS 9215893  9/1992  WIPO.

OTHER PUBLICATIONS

Microchip™, MTA11200, True Gauge™ Intelligent Battery Management IC, Oct. 1993, pp. 1–44.
Duracell Intel®, Smart Battery Specifications, Apr. 21, 1994.

*Primary Examiner*—Peter S. Wong
*Assistant Examiner*—Gregory J. Toatley, Jr.
*Attorney, Agent, or Firm*—Blakely, Sokoloff, Taylor & Zafman

[57] ABSTRACT

A novel battery monitoring device is described. The monitoring device determines amount of battery self-discharge, determines amount of battery discharge from a monitoring circuit, determines amount of battery discharge from a host device when the host device is in a first power consumption mode, and determines amount of battery discharge from the host device when the host device is in a second power consumption mode. The first mode causes greater discharge of the battery during a given period of time than the second mode.

38 Claims, 10 Drawing Sheets

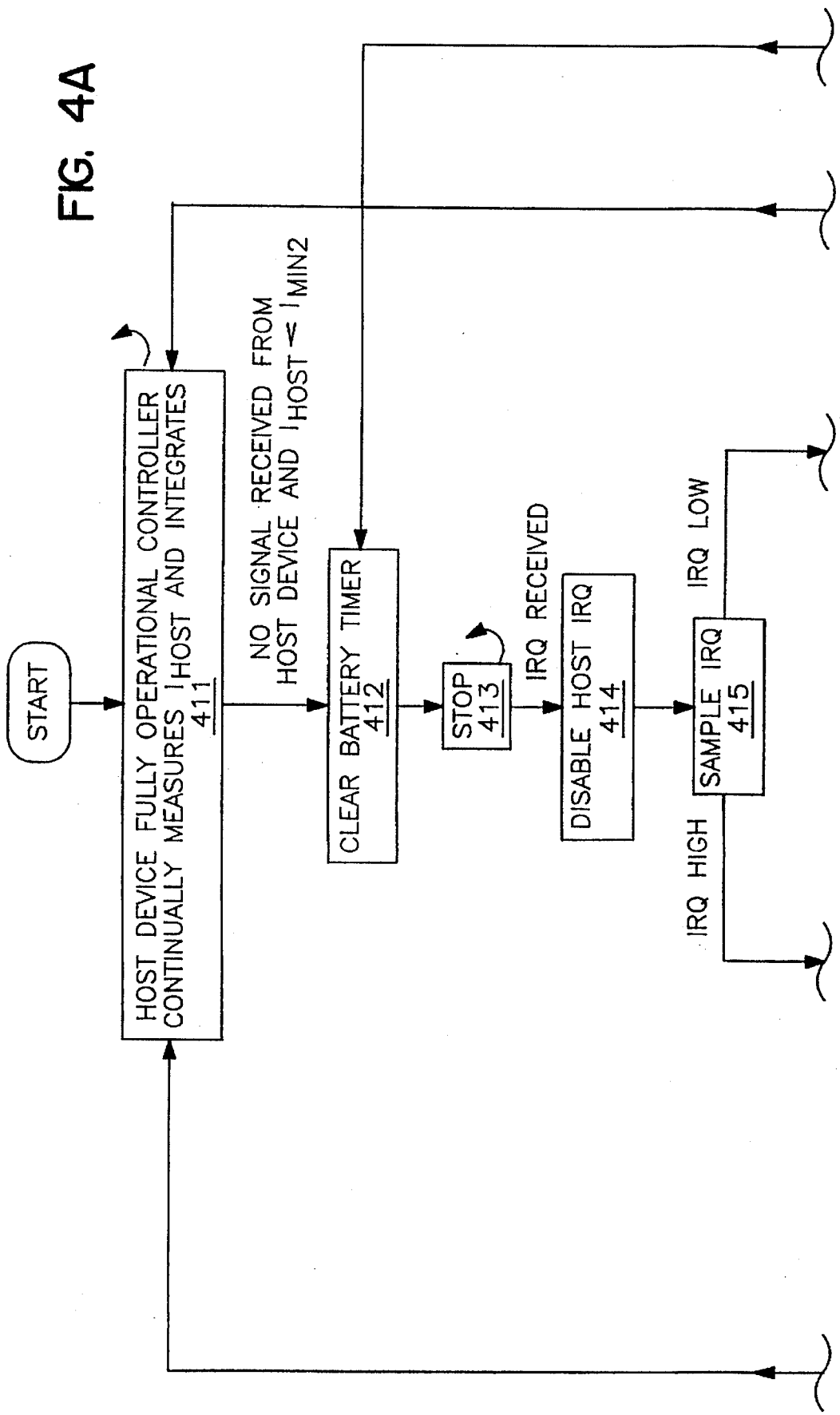

5,640,081

METHOD AND APPARATUS FOR MONITORING DISCHARGE OF A BATTERY DEVICE BASED ON BATTERY SELF-DISCHARGE AND DISCHARGE OVER TIME

FIELD OF THE INVENTION

The present invention relates to the field of charge storage devices. More particularly, the present invention relates to the monitoring of charge storage devices.

BACKGROUND OF THE INVENTION

Existing portable computer systems and other electronic devices are often powered by charge storage devices such as a battery. These electronic devices often lack the capability to monitor charge consumption from the battery. Without such monitoring, the user cannot determine the remaining usage time before a required recharge or battery replacement and can experience an inconvenient interruption due to battery depletion. Thus, it is desirable to have accurate monitoring of charge consumption so that the user can determine remaining usage time and plan use of the electronic device accordingly.

One prior battery monitoring system measured charge dissipation by measuring current drawn from the battery. However, the prior monitoring system was inaccurate.

In addition, some electronic devices and some battery monitoring systems utilized timers with oscillators that consumed relatively large amounts of current.

Thus, what is needed is a more accurate battery monitoring device.

What is also needed is an oscillator and an inverter that consumes less power.

SUMMARY OF THE INVENTION

A novel method and apparatus for monitoring discharge of a battery is described. The method comprises of determining amount of battery self-discharge, determining amount of battery discharge from a monitoring circuit, determining amount of battery discharge from a host device when the host device is in a first power consumption mode, and determining amount of battery discharge from the host device when the host device is in a second power consumption mode, the first mode causing greater discharge of the battery during a given period of time than the second mode. The method can also comprise of determining the power consumption mode of the host device and can also comprise of determining whether the battery is coupled to the host device.

The monitoring apparatus comprises a current measuring apparatus capable of determining current drawn by a host device, a controller coupled to the current measuring apparatus and a memory device coupled to the controller capable of storing battery data. The controller is capable of determining battery self-discharge, determining battery discharge from a monitoring circuit, determining battery discharge from a host device when the host device is in a first power consumption mode, and determining battery discharge from the host device when the host device is in a second power consumption mode, the first mode causing greater discharge of the battery during a given period of time than the second mode. The monitoring apparatus can further comprise a timer apparatus having a capacitor for storing charge, first resistor coupled to the capacitor capable of delaying discharge of the capacitor, a inverter coupled to the capacitor and having a first input, and a switch coupled to the first input of the first inverter and coupled to the capacitor. The switch has a second input and is capable of applying a first voltage potential on the first input when a voltage potential on the second input is above a threshold voltage of the switch. The switch is capable of applying a second voltage potential on the first input when a voltage potential on the second input is below the threshold voltage. The inverter is capable of applying charge to the capacitor when a voltage potential on the first input is above a first threshold voltage and is capable of removing charge from the capacitor when the voltage potential on the first input is below a second threshold voltage.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

A novel method and apparatus for monitoring battery discharge is described. In the following description, the invention is described with reference to specific exemplary embodiments thereof. It will, however, be evident that various modifications and changes may be made thereto without departing from the broader spirit and scope of the invention as set forth in the appended claims. The specifications and drawings are, accordingly, to be regarded in an illustrative rather than a restrictive sense.

Figure 1:
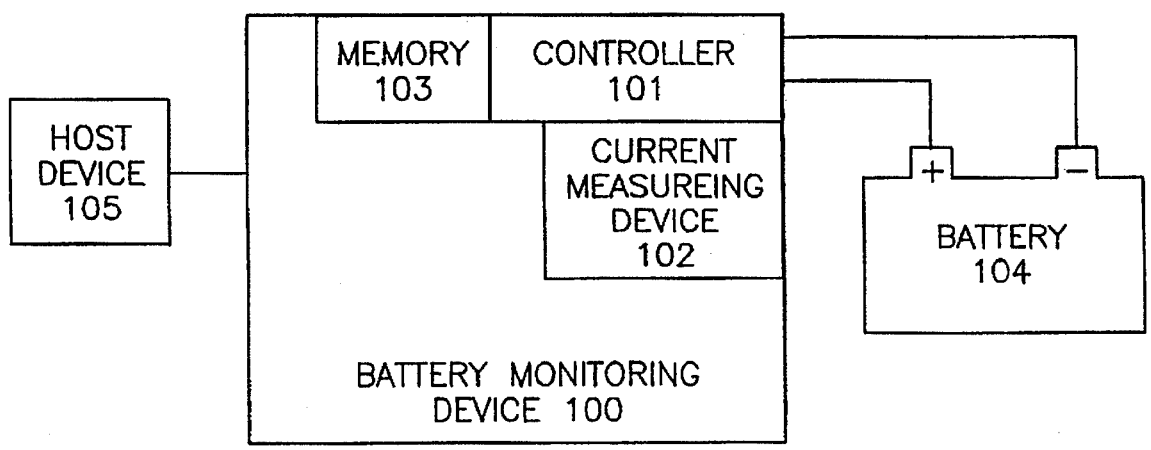
FIG. 1 illustrates in block diagram form a battery monitoring device of one embodiment of the present invention.

FIG. 1 illustrates in block diagram form a battery monitoring device of one embodiment of the present invention. Battery monitoring device 100 comprises of controller 101, current measuring device 102 and memory 103. Controller 101 is coupled to current measuring device 102 and is coupled to memory 103. Controller 101 can be a microcontroller or other similar device. Memory 103 can be an Electrically Erasable Programmable Read Only Memory (EEPROM), a random access memory (RAM) or other memory device. In the first embodiment, memory 103 is a device separate from controller 101. However, it will be appreciated that memory 103 can be incorporated into controller 101. Battery monitoring device 100 is coupled to battery 104. Battery 104 can be a nickel cadmium (NiCd) battery or other rechargeable battery. Battery monitoring device 100 is also coupled to host device 105. Host device 105 can be a portable computer system or a cellular telephone or other electronic device. Under the first embodiment, battery monitoring device 100 and battery 104 can be decoupled from host device 105. Controller 101 is capable of determining battery self-discharge which includes loss of charge due to self-discharge of the battery cells. Controller 101 also determines the battery discharge caused by current drawn by the battery monitoring circuit in battery monitoring device 100. In addition, controller 101 determines battery discharge attributable to host device 105 when host device 105 is in a first power consumption mode. Moreover, controller 101 can determine battery discharge attributable to host device 105 when host device 105 is in a second power consumption mode. The first power consumption mode can be a fully operational or "on" mode where host device 105 is fully operational. The second power consumption mode can be an "off" mode where host device 105 is not operational. The battery discharge in the second mode can be caused by leakages in host device 105 and components in host device 105 which remain activated. It will be appreciate that host device 105 can also have additional modes including various low-power modes where current is small but not zero.

By taking into account more sources of charge dissipation, controller 101 can make a more accurate determination of remaining charge in battery 104. Some sources of charge dissipation although small when compared to the charge dissipated by operating host device 105, can become substantial over a long period of time. The failure to account for them can introduce large errors into any determination of charge remaining in the battery and likewise introduce errors into a determination of remaining usage time. The errors can become large when host device 105 is off for long periods of time.

Current measuring device 102 measures the current drawn by host device 105. Under an alternative embodiment, current measuring device 102 measures the current drawn across the terminals of battery 104. Memory 103 stores a value representing the remaining charge in battery 104. It also stores a value representing the full capacity of battery 104. As battery 104 is discharged, controller 101 determines battery self-discharge, battery discharge from the monitoring circuit, battery discharge from host device 105 when it is in a first power consumption mode and battery discharge from host device 105 when it is in a second power consumption mode. Controller 101 utilizes the battery discharge information and updates the value in memory 103 representing the remaining charge in battery 104. In this manner, battery monitoring device 100 periodically monitors battery 104 and stores information representing the remaining charge in battery 104. Using this information, host device 105 or controller 101 can determine the remaining operation time of host device 105 before a required charging of battery 104. In addition, controller 101 stores a value representing the full capacity of memory 103. Using this information combined with the value representing the remaining charge in battery 104, host device 105 or controller 101 can determine the total charge utilized since the last charging. Moreover, controller 101 can change the value representing the full capacity of battery 104 to reflect degradation in battery capacity through time. Under an alternative embodiment, memory device 103 stores a value representing the amount of charge dissipated from the battery. It will be appreciated that this value when subtracted from the value representing the full capacity of battery 104 results in the charge remaining in battery 104.

Figure 2:
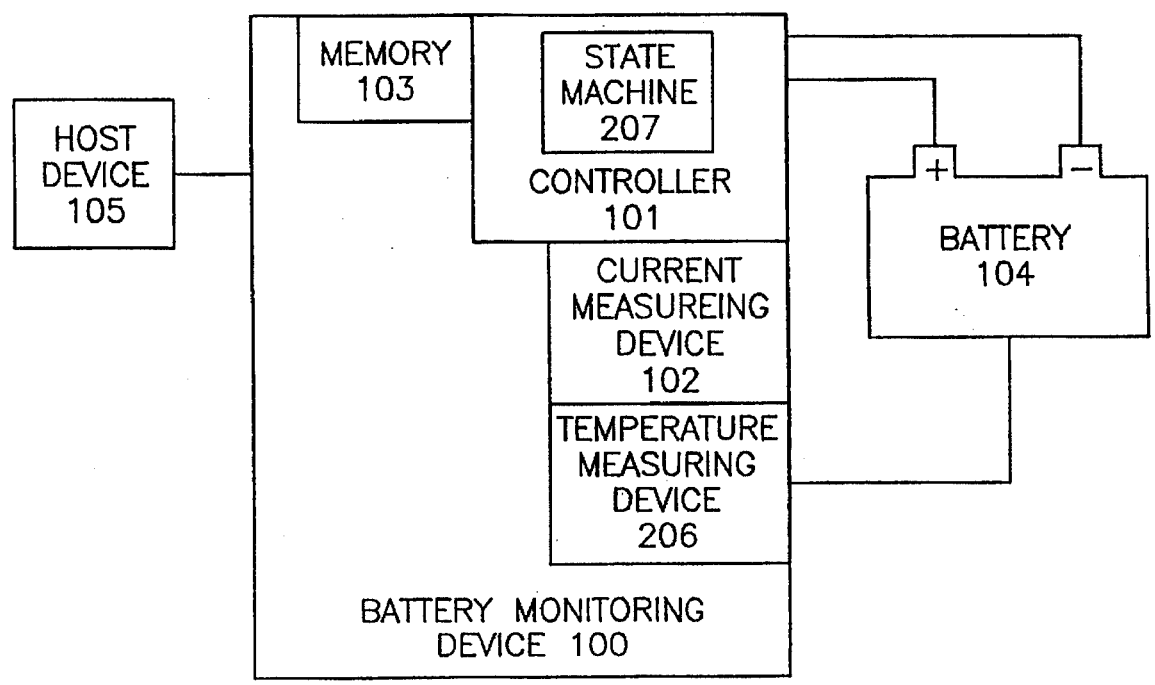
FIG. 2 illustrates in block diagram form a battery monitoring device of a second embodiment of the present invention.

FIG. 2 illustrates in block diagram form a battery monitoring device of a second embodiment of the present invention. Here, battery monitoring device 100 comprises of controller 101, current measuring device 102, memory 103 and temperature measuring device 206. Controller 101 further comprises of state machine 207. State machine 207 may be a microcontroller or microprocessor. Alternatively, state machine 207 may be located outside of controller 101. State machine 207 performs the battery monitoring operations of controller 101. Temperature measuring device 206 measures the temperature of battery 104. Battery temperature is measured because the rate of battery self-discharge is dependent on battery temperature. Battery monitoring device 100 takes battery temperature into account in determining battery self-discharge. In the second embodiment, temperature measuring device 206 comprises of one or two thermistor devices in thermal contact with battery 104. The thermistor comprises a resistor which experiences changes in resistance as a function of temperature. The resistor is a part of a voltage divider and as resistance changes, the voltage across the resistor changes. This voltage is provided as an input to controller 101 which has an analog-to-digital converter for digitizing the voltage measurement.

In the second embodiment of the present invention, host device 105 has three power consumption modes. The three modes offer different levels of operational capability with different levels of power consumption. By switching to the appropriate mode given certain predetermined parameters such as idle time, time of day, user input and the like, host device 105 can reduce power consumption by switching from the fully operational mode with high power consumption to a mode with less operational capability and less power consumption. It will be appreciated that host device 105 may also incorporate more than three operational modes with corresponding levels of operational capability or less than three modes.

When host device 105 is a portable telephone, the first mode can be the "communicate" mode. In this mode, the telephone is fully operational both transmitting and receiving signals. The operational capability and the power consumption is high. The second mode can be the "standby" mode. Here, the telephone is responsive to incoming calls but is not continually transmitting and receiving signals. The operational capability and the power consumption is lower. The third mode can be the "off" mode. Here, the telephone is shut off and is not responsive to incoming calls. It does not send nor receive signals. The operational capability and power consumption is the lowest.

Similarly, when host device 105 is a portable computer, it can also have three modes. The first mode can be the RUN mode. Here, the central processing unit is on and the random access memory is on giving the computer full operational capability. In the RUN mode, the current drawn by host device 105 is greater than 15 milliamps. The second mode can be the SLEEP mode. Here, the central processing unit is off but the random access memory remains on. The computer does not have full operational capability but it can become fully operational in a short period of time. In the SLEEP mode, the current drawn by host device 105 is greater than 1.5 milliamps but less than 15 milliamps. The third mode can be the SHUTDOWN mode. Here, both the central processing unit and the random access memory is off.

The computer has low operational capability and takes a significant period of time to become fully operational. In the SHUTDOWN mode, the current drawn by host device 105 is less than 1.5 milliamps. Battery monitoring device 100 can determine the operational mode of host device 105 by measuring the current drawn by host device 105. It will be appreciated that the actual current values used to determine the operational modes can be varied depending on the operational parameters of host device 105 in each of the operational modes.

In the RUN mode, battery monitoring device 100 continually measures the current drawn by host device 105 and continually integrates the current to determine the charge dissipated over time. Host device 105 in the RUN mode can have a wide variation in power consumption over a given time period. This variation occurs because individual components in host device 105 are activated and deactivated depending on the specific operation performed. Because of the variation, battery monitoring device 100 needs to continually measure and integrate current to make an accurate determination of charge dissipation.

In the SLEEP mode, the variation in power consumption is not as large because most of the high power consumption components in host device 105 remain deactivated. Thus, it is possible to periodically measure the current and still retain a high degree of accuracy in determining charge dissipation. Periodic measurement has the advantage over continuous measurement of decreased power consumption. With periodic measurement, the monitoring circuits can be powered down in the time interval between each measurement thus reducing power consumption. In the second embodiment, battery monitoring device 100 measures the current every three minutes when host device 105 is in the SLEEP mode.

In the SHUTDOWN mode, the variation in power consumption is also relatively small because most components in host device 105 remain deactivated. Thus, to reduce power consumption of the monitoring circuits, battery monitoring device 100 also utilizes periodic measurement in the SHUTDOWN mode. In this embodiment, the time interval is also three minutes. However, in the SHUTDOWN mode, an additional problem exists. In the SHUTDOWN mode, the total current drawn by host device 105 is less than 0.5 milliamps. This low level of current makes accurate measurement of actual current difficult. Thus, to overcome the problem, in this embodiment, battery monitoring circuit 100 utilizes predetermined values for the amount of current drawn by host device 105 in SHUTDOWN mode during each time interval. It also utilizes predetermined values for the amount of current drawn by battery monitoring device 100 during each time interval, and the discharge attributable to battery 104 self-discharge at the measured temperature. Using the predetermined current values, battery monitoring device 100 can determine the charge dissipated during each time interval. The predetermined values can be stored in memory 103 during initial configuration of the system.

When host device 105 is decoupled from battery 104, the variation in power consumption is not as large because host device 105 no longer draws current from battery 104. Battery monitoring device 100 only has to account for charge dissipation from its own circuits and from battery self-discharge. Thus, to reduce power consumption of the monitoring circuits, battery monitoring device 100 also utilizes periodic measurement when host device 105 is decoupled. In the second embodiment, when host device 105 is decoupled, the time interval is four minutes. However, like the SHUTDOWN mode, an additional problem exists. The total current drawn by battery monitoring device 100 during most of the time interval is also less than 0.5 milliamps. This low level of current makes accurate measurement of actual current difficult. Thus, to overcome the problem, in the second embodiment, battery monitoring circuit 100 utilizes predetermined values for the amount of current drawn by its own circuits during each time interval and the discharge attributable to battery 104 self-discharge at the measured temperature. Using the predetermined current values, battery monitoring device 100 can determine the charge dissipated during each time interval. The predetermined values can be stored in memory 103 during initial configuration of the system.

Figure 3:
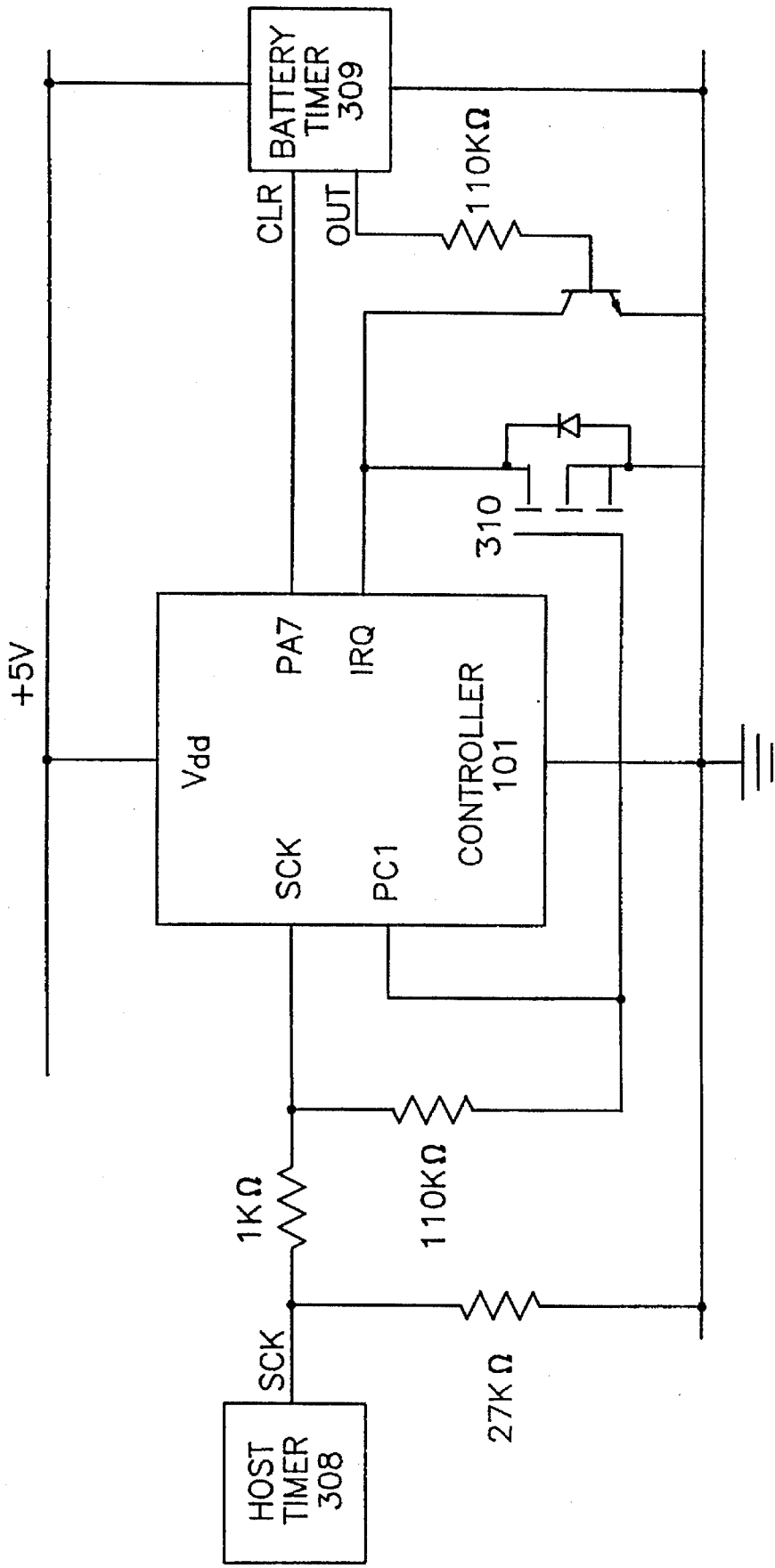
FIG. 3 illustrates in circuit diagram form a battery monitoring device of a third embodiment of the present invention.

FIG. 3 illustrates in circuit diagram form a battery monitoring device of a third embodiment of the present invention. In this embodiment, controller 101 is coupled to host timer 308 and is also coupled to battery timer 309. In normal operation, host device 105 is fully operational and it continually sends signals to controller 101. Controller 101 and battery monitoring device 100 continually measures the current drawn by host device 105. Controller 101 integrates the value representing the current over time to determine the total charge dissipated by battery 104. When host device 105 is idle, it no longer sends signals continuously to controller 101. After a specified time period, in the third embodiment, four seconds, controller 101 sends a CLR signal through its PA7 node to battery timer 309 if the measured current is less than a preassigned value, here 15 milliamps. In response to this signal, battery timer 309 clears the timer in its internal circuit. Controller 101 then enters the STOP mode. In this mode, the circuits of battery monitoring device 100 and controller 101 are powered down to reduce battery consumption. Controller 101 remains in this state until it receives an IRQ interrupt request signal. The IRQ signal is an active low signal and can come from battery timer 309 through its OUT node or from host timer 308 through the SCK line. Controller 101 can determine the source of a IRQ signal by disabling the interrupt request line from host timer 308. When the interrupt request line from host timer 308 is disabled and the IRQ signal goes away, controller 101 can determine that the IRQ signal originated from host timer 308. On the other hand, when controller 101 disables the interrupt request line from host timer 308 and the IRQ signal does not go away, controller 101 can determine that the IRQ signal originated from battery timer 309. Controller 101 disables the interrupt request line from host timer 308 by bringing the PC1 node to a low potential. Because of the large resistance of the 110 kiloohm resistor, the gate of transistor 310 is brought to a low potential even if post timer 308 brings the SCK line to a high potential.

In the third embodiment, host timer 308 transmits an IRQ signal at each specified time interval of three minutes when host device 105 is in SLEEP or SHUTDOWN mode and battery monitoring device 100 is in the STOP mode. When battery monitoring device 100 is decoupled from host device 105, it is also decoupled from host timer 308 and thus no longer receives an IRQ signal from host timer 308. In addition, when host device 105 is in the fully operational mode, host device 105 continually sends signals to battery monitoring device 100 or draws more than 15 milliamps of current and controller 101 disables any IRQ signals from host timer 308 by holding PC1 low, and prevents the generation of IRQ signals from battery timer 309 by continuously clearing the timer circuit. Under the third embodiment, battery timer 309 also issues an IRQ signal after every specified time interval provided timer has not been cleared before the expiration of the time interval. However, the time interval is a longer interval of four minutes. When battery monitoring device 100 and controller 101 are coupled to host timer 308, battery timer 309 does not transmit an IRQ signal in the STOP mode. The time interval for battery timer 309 is longer than the time interval for host timer 308 and consequently, controller 101 will always issue a CLR signal through its PA7 node to battery timer 309 before battery timer 309 can transmit an IRQ signal. When battery monitoring device 100 is decoupled from host device 105, controller 101 no longer receives an IRQ signal from host timer 308 and does not transmit a CLR signal to battery timer 309 until it receives an IRQ signal from battery timer 309. With the operation of host timer 308 and battery timer 309 as described above, when controller 101 is in the STOP mode, it receives an IRQ signal from host timer 308 every three minutes if battery monitoring device 100 is coupled to host device 105. On the other hand, if battery monitoring device 100 is decoupled from host device 105, controller 101 receives and IRQ signal every four minutes from battery timer 309 in the STOP mode.

Figure 4B:
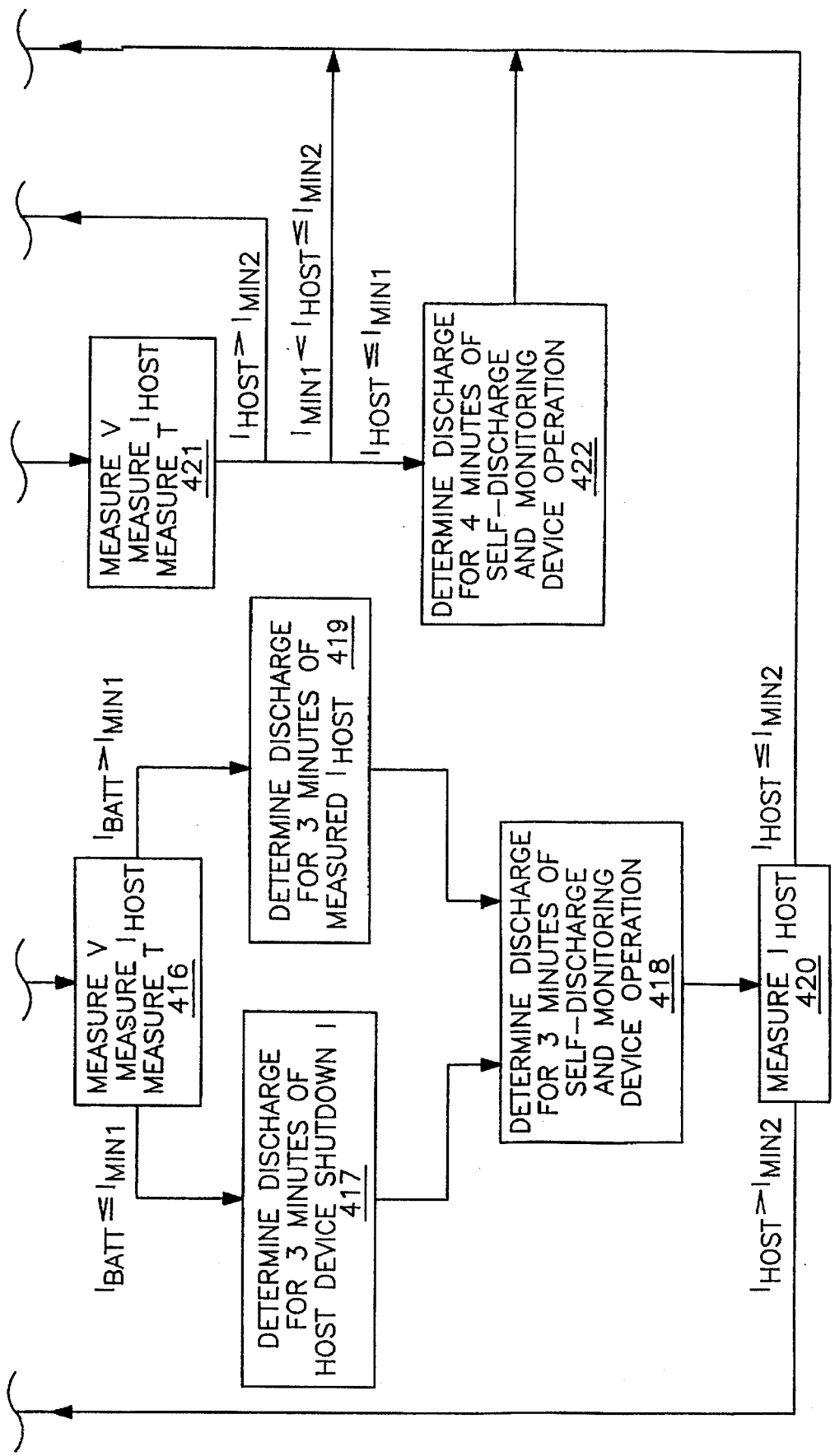
FIG. 4 illustrates in state diagram form the operation of the state machine of FIG. 2.

FIG. 4 illustrates in state diagram form the operation of the state machine of FIG. 2. When controller 101 is powered up, it enters into the fully operational state or RUN mode, state 411. In this state, host device 105 is fully operational and continually sends signals to controller 101. Controller 101 continually measures the current drawn by host device 105 and integrates the measured value over time to determine the total charge dissipated from battery 104. Controller 101 performs the integration function by applying a smaller current through an integration circuit corresponding to the measured current. Each measured current value has a corresponding smaller value which is applied to the integration circuit when the particular measured current is drawn from battery 104. The integration circuit comprises a capacitor. When the smaller current is applied through the integration circuit, charge is applied to the capacitor proportional to the current level. By measuring the voltage across the capacitor, controller 101 can determine the charge on the capacitor. It will be appreciated that this charge value is proportional to the charge dissipated by battery 104 which is in turn the integration of the current drawn by host device 105 over time. When the charge on the capacitor reaches a predetermined value, controller 101 stores data reflecting the charge accumulated on the capacitor into memory. It also adds the data to previous data stored in memory reflecting charge accumulated previously. Controller 101 then discharges the capacitor and continues the integration function. Controller 104 remains in the fully operational state until the measured current is below a threshold of $I_{MIN2}$ 15 milliamps and it fails to receive a signal from host device 105 for a specified time interval of four seconds. Controller 101 then transitions to state 412 where it sends a CLR signal through its PA7 node to battery timer 309 to clear battery timer 309. Controller 101 then transitions to state 413 where it enters STOP mode.

In the STOP mode, the circuits of battery monitoring device 100 and controller 101 are powered down. Controller 101 does not perform any measurements of current or battery temperature. It also does not perform any integration functions of battery current. In this mode, controller 101 only consumes approximately 50 microamps of current. However, controller 101 is responsive to an IRQ signal. It remains in the STOP mode until it receives IRQ signal. At that point, controller 101 transitions to state 414 where it disables the interrupt request line from host device 105. Controller 101 then transitions to state 415 where it samples the active low IRQ signal line. If the IRQ signal line is at a high voltage potential, controller 101 can determine that the IRQ signal originated from host device 105. Controller 101 transitions to state 416 where it measures the voltage across the terminals of battery 104, measures the current drawn by host device 105, and measures the temperature of battery 104.

If the measured value of current $I_{BATT}$ ($I_{HOST}$) is $I_{BATT}$ ($I_{HOST}$) less than or equal to a preassigned value $I_{MIN1}$ of 1.5 milliamps, controller 101 determines that host device 105 is in the SHUTDOWN mode. In this SHUTDOWN mode, the central processing unit and random access memory of host device 105 is off. In this mode, host device 105 consumes less than 0.5 milliamps. Controller 101 transitions to state 417 where it determines the battery discharge for three minutes of host device 105 operation in the SHUTDOWN mode. This determination is made by speeding up a counter and making the counter account for the charge dissipated by three minutes of host device 105 operation in the SHUTDOWN mode. The counter utilizes predetermined data for charge dissipation in a given period of time. This predetermined data can be stored in memory 103 or otherwise programmed into controller 101. Controller 101 then updates memory 103 to reflect the three minutes of charge dissipation. Controller 101 then transitions to state 418 where it determines the battery discharge attributable to three minutes of battery self-discharge and determines the discharge for three minutes of battery monitoring device operation. Like the determination made in state 417, controller 101 speeds up a counter to account for three minutes of battery self-discharge and battery monitoring device operation in the STOP mode. The counter utilizes predetermined data for charge dissipation in a given period of time due to self-discharge and monitoring device operation. Controller 101 then updates memory 103 to reflect three minutes of charge dissipation.

If, on the other hand, the measured battery current $I_{BATT}$ ($I_{HOST}$) exceeds a preassigned value $I_{MIN1}$ of 1.5 milliamps, controller 101 determines that host device 105 is in the SLEEP mode. In this SLEEP mode, the central processing unit in host device 104 is off, but the random access memory is on. Host device 105 consumes approximately 5–10 milliamps in the SLEEP mode. Here, controller 101 transitions to state 419 where it determines the discharge for three minutes of operation at the measured current value. Like the determination made in state 417 and state 418, controller 101 speeds up a counter to account for three minutes of SLEEP operation at the measured current value. The counter utilizes the measured current value and counts through three minutes of measured current. Controller 101 then updates memory 103 to reflect three minutes of charge dissipation. Controller 101 then transitions to state 418 where it determines the discharge for three minutes of battery self-discharge and determines the discharge for three minutes of battery monitoring device operation. After state 418, controller 101 transitions to state 420 where it, again, measures the current drawn across the terminals of battery 104. If the measured current value exceeds the preassigned value $I_{MIN2}$ of 15 milliamps, controller 101 determines that host device 105 is fully operational (RUN mode) where the central processing unit and the random access memory is on. It then transitions back to state 411. If, on the other hand, the measured current value is less than or equal to the preassigned value $I_{MIN2}$ of 15 milliamps, controller 101 determines that host device 105 is not in the fully operational mode or is decoupled from battery monitoring device 100. Controller 101 then transitions back to state 412.

If host device 105 is decoupled from battery 104 and battery monitoring device 100, the IRQ signal line will be at a low potential when controller 101 samples the active low IRQ signal line in state 415. Controller 101 can then determine that the IRQ signal originated from battery timer 309. Controller 101 transitions to state 421 where it measures the voltage across the terminals of battery 104, measures the current drawn by host device 105, and measures the temperature of battery 104. If the measured value of current is less than or equal to an assigned value $IMIN_1$ of 1.5 milliamps, controller 101 determines that host device 105 is decoupled from battery 104. Here, battery 104 and battery monitoring device 100 consumes less than 0.5 milliamps. Controller 101 transitions to state 422 where it determines the battery discharge for four minutes of battery self-discharge and determines the discharge for four minutes of battery monitoring device operation. Controller 101 speeds up a counter to account for four minutes of battery self-discharge and battery monitoring device operation. The counter utilizes predetermined data for charge dissipation in a given period of time due to self-discharge and monitoring device operation. Controller 101 then updates memory 103 to reflect four minutes of charge dissipation.

If, on the other hand, the measured battery current exceeds a preassigned value $I_{MIN1}$ of 1.5 milliamps and exceeds the preassigned value $I_{MIN1}$ of 15 milliamps, controller 101 determines that host device 105 is fully operational (RUN mode) where the central processing unit and the random access memory is on. It then transitions back to state 411. If, on the other hand, the measured current value is less than or equal to the preassigned value $I_{MIN2}$ of 15 milliamps and greater than the preassigned value $I_{MIN1}$ of 1.5 milliamps, controller 101 determines that host device 105 is not in the fully operational mode. Controller 101 then transitions back to state 412.

Figure 5A:
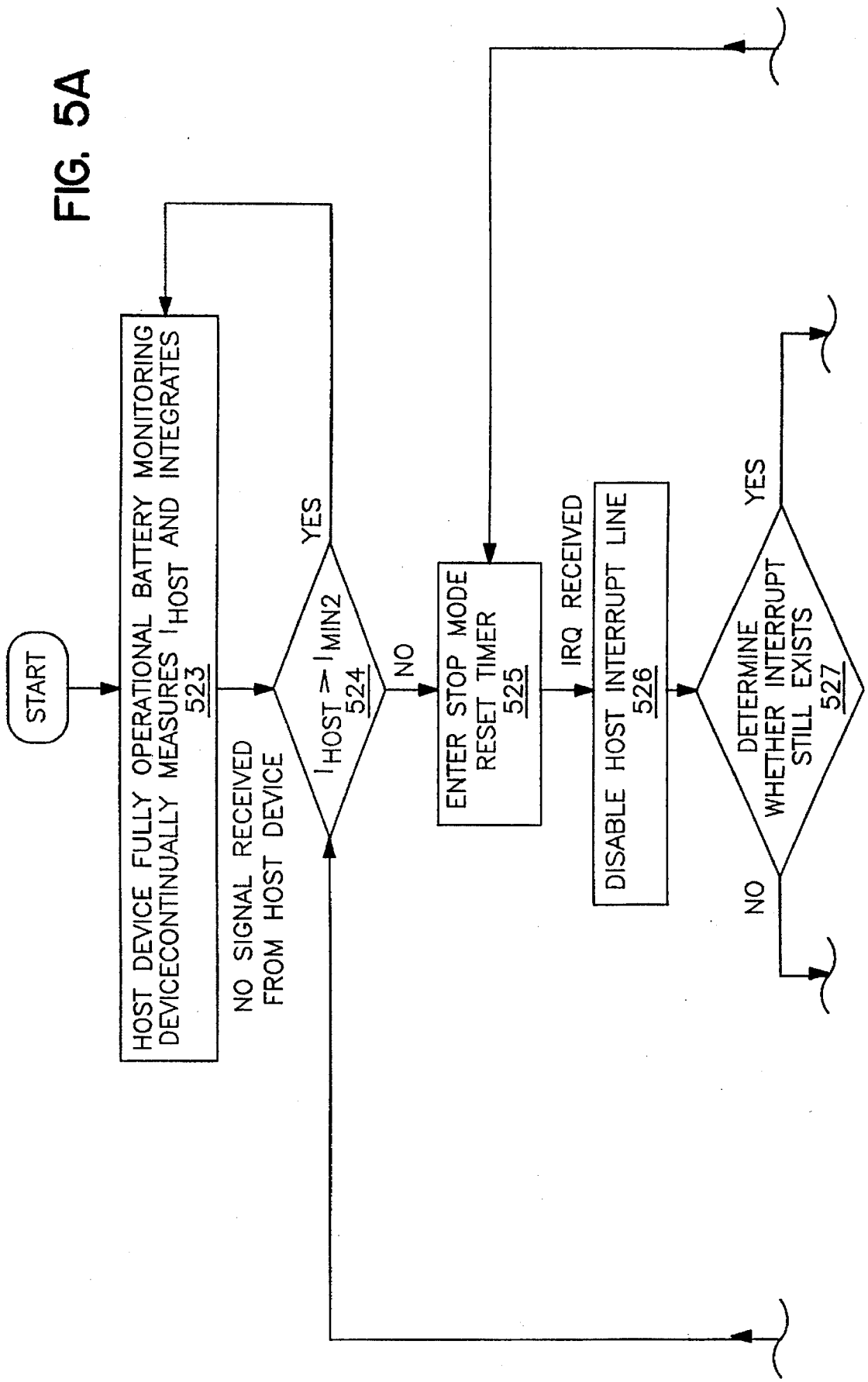
FIG. 5 illustrates in flow chart diagram form a method for monitoring discharge of a battery of a fourth embodiment of the present invention.
Figure 5B:
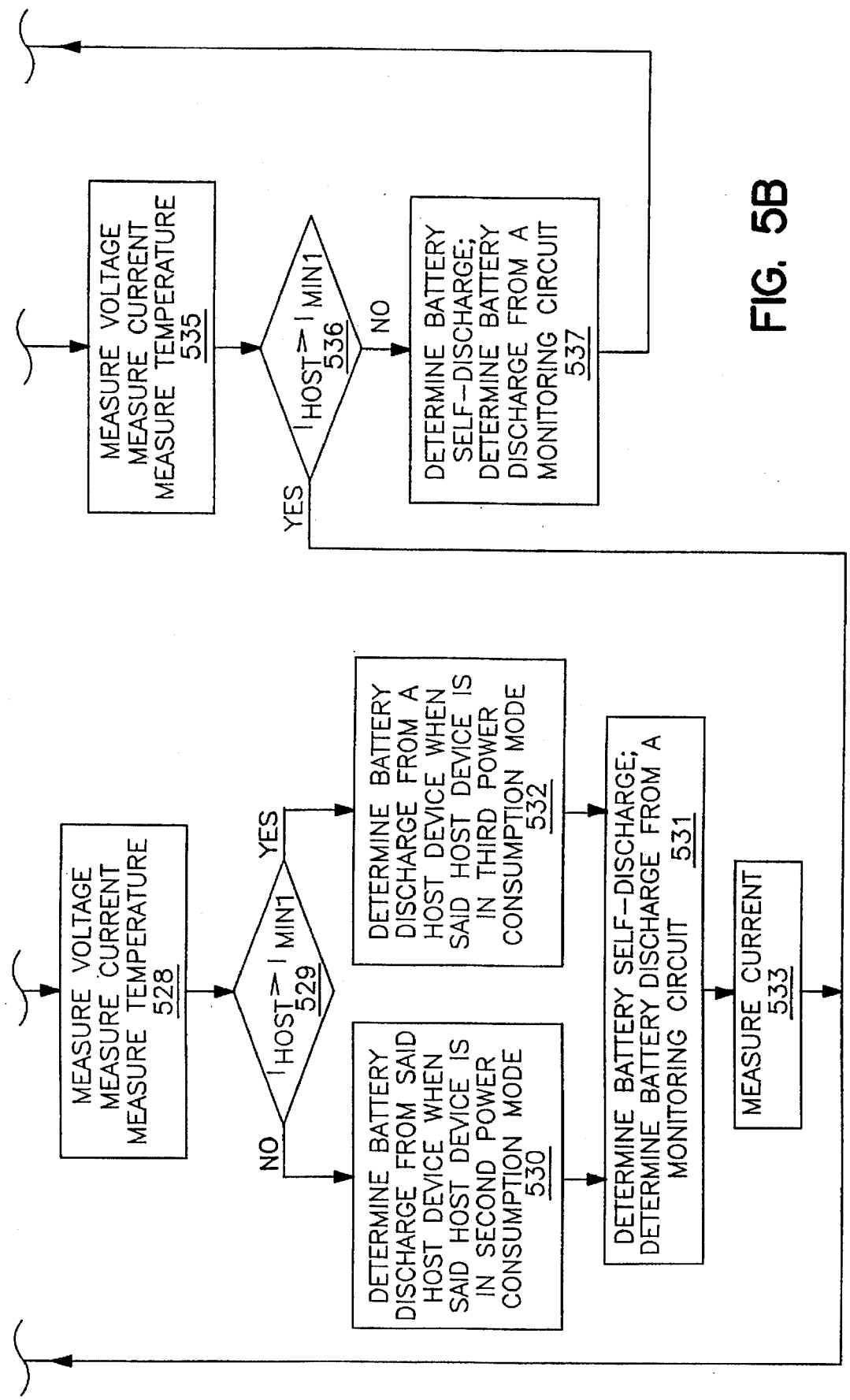

FIG. 5 illustrates in flow chart diagram form a method for monitoring discharge of a battery of a fourth embodiment of the present invention. When host device 105 and battery monitoring device 100 are powered up, host device 105 enters into the first power consumption mode, the RUN mode. In the RUN mode, host device 105 is fully operational and continually sends signals to battery monitoring device 100, block 523. Battery monitoring device 100 continually measures the current drawn by host device 105 and integrates the measured value over time to determine the total charge dissipated from battery 104. In this manner, battery monitoring device 100 determines the amount of battery discharge from host device 105 when host device 105 is on. Battery monitoring device 100 continues to measure the current drawn by host device 105 and continues to integrate the measured value over time until it fails to receive a signal from host device 105 for a specified time interval of four seconds while the current is below the preassigned value $I_{MIN2}$ of 15 milliamps, block 524. When this event occurs, battery monitoring device 100 resets battery timer 309 by sending a CLR signal to battery timer 309, block 525. Battery monitoring device 100 then enters the STOP mode.

In the STOP mode, most of the circuits of battery monitoring device 100 are powered down. Battery monitoring device 100 does not perform any measurements of current or battery temperature. It also does not perform any integration functions of current. Battery monitoring device 100 remains in the STOP mode until controller 101 receives an IRQ signal. Host device 105 sends a first IRQ signal after a first time interval of three minutes when battery 104 and battery monitoring device 100 are coupled to host device 105. On the other hand, battery 104 sends a second IRQ interrupt signal after a second time interval of four minutes when battery 104 and battery monitoring device 100 are decoupled from host device 105. The first time interval of three minutes is shorter than the second time interval of four minutes and thus, battery 104 does not send the second IRQ signal when battery 104 and battery monitoring device 100 are coupled to host device 105.

Controller 101 then determines whether battery 104 and battery monitoring device 100 are coupled to host device 105 by first disabling the interrupt request line from host device 105, block 526. It then determines whether the interrupt request still exists (e.g. remains low), block 527. If the interrupt request no longer exists, controller 101 can determine that battery 104 and battery monitoring device 100 are coupled to host device 105. Battery monitoring device 100 then measures the voltage across the terminals of battery 104. It also measures the temperature of battery 104 and measures the current drawn by host device 105, block 528. If the measured value of battery current is less than or equal to a preassigned value $I_{MIN1}$ of 1.5 milliamps, controller 101 determines that host device 105 is in the second power consumption mode, the SHUTDOWN mode. On the other hand, if the measured value of battery current is greater than the preassigned value $I_{MIN1}$ of 1.5 milliamps, controller 101 determines that host device 105 is in the third power consumption mode, the SLEEP mode, block 529.

If host device 105 is in the SHUTDOWN mode, battery monitoring device 100 determines the amount of battery discharge from host device 105 when host device 105 is in a second power consumption mode, block 530. It makes this determination by calculating battery discharge from host device 105 over a first time interval of three minutes. Battery monitoring device 100 then determines the amount of battery self-discharge and determines the amount of battery discharge from its monitoring circuits, block 531. Battery monitoring device 100 determines the amount of battery self-discharge by calculating battery self-discharge over a specified time interval. In this case, because battery 104 is coupled to host device 105, battery monitoring device 100 calculates battery self-discharge over the first time interval of three minutes.

When host device 105 is in the SLEEP mode, after block 529, battery monitoring device 100 determines the amount of battery discharge from host device 105 when host device 105 is in a third power consumption mode 1 block 532. It determines the amount of battery discharge by measuring the current drawn by host device 105 and calculating battery discharge from host device 105 over a specified time interval using the measured current value. In this case, because battery 104 is coupled to host device 105, the specified time interval is the first time interval of three minutes. Battery monitoring device 100 then determines the amount of battery self-discharge and determines the amount of battery discharge from its monitoring circuits as described above for block 531. Whether host device 105 is in SHUTDOWN mode or the SLEEP mode, after block 531, battery monitoring device 100 again measures the current drawn across the terminals of 104, block 533. If the measured value of battery current is less than or equal to a preassigned value $I_{MIN2}$ of 15 milliamps, battery monitoring device 100 determines that host device 105 is in the SHUTDOWN mode or the SLEEP mode or is decoupled from battery 104. In this case, battery monitoring device 100 transitions back to block 525. On the other hand, if the measured value of battery current is greater than the preassigned value $I_{MIN2}$ of 15 milliamps, battery monitoring device 100 determines that host device 105 is in the RUN mode and transitions to block 523. In this manner, battery monitoring device 100 determines whether host device 105 has switched to a fully operational mode.

If host device 105 is decoupled from battery 104 and battery monitoring device 100, the interrupt request will still exist after controller 101 disables the interrupt request line from host device 105 in block 526. Controller 101 will then determine that the interrupt still exists in block 527. Battery monitoring device 100 then measures the voltage across the terminals of battery 104. It also measures the temperature of battery 104 and measures the current drawn by host device 105, block 535. If the measured value of battery current is less than or equal to a preassigned value $I_{MIN1}$ of 1.5 milliamps, controller 101 determines that host device 105 is decoupled from battery 104. On the other hand, if the measured value of battery current is greater than the preassigned value $I_{MIN1}$ of 1.5 milliamps, controller 101 determines that host device 105 is recoupled to battery 104, block 536. Thus, controller 101 can determine whether host device 105 coupled to battery 104. If host device 105 is decoupled from battery 104, battery monitoring device 100 determines the amount of battery self-discharge and determines the amount of battery discharge from its monitoring circuits, block 537. Battery monitoring device 100 determines the amount of battery self-discharge by calculating battery self-discharge over a specified time interval. In this case, because battery 104 is decoupled from host device 105, battery monitoring device 100 calculates battery self-discharge over the second time interval of four minutes. Battery monitoring device 100 determines the amount of battery discharge from its monitoring circuits by calculating battery discharge from its monitoring circuits over a specified time interval. In this case, because battery 104 is decoupled from host device 105, battery monitoring device 100 calculates battery discharge from its monitoring circuits over the second time interval of four minutes.

If the measured value of battery current is greater than the preassigned value $I_{MIN1}$ of 1.5 milliamps in block 536, battery monitoring device 100 determines if the measured value $I_{MIN2}$ of battery current is greater than the preassigned value of 15 milliamps, block 524 and proceeds to block 523 or 525 as described above. In this manner, battery monitoring device 100 determines whether host device 105 has been recoupled and whether host device 105 has switched to a fully operational mode (RUN mode).

In addition, it would be appreciated that battery monitoring device 100 can determine the operational mode of host device 105 by measuring the battery current and determining whether host device 105 is coupled to battery 104 and battery monitoring device 100.

Figure 6:
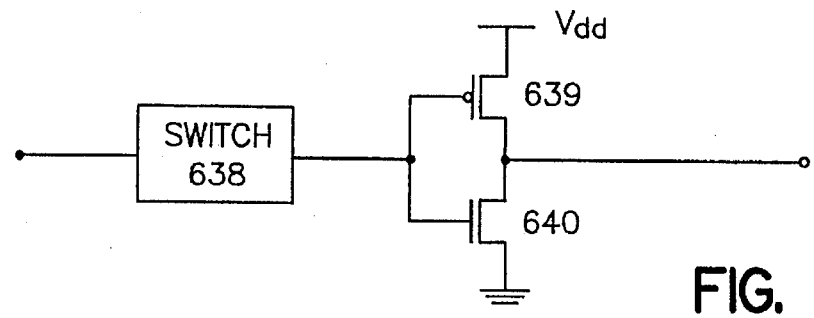
FIG. 6 illustrates in circuit diagram form an inverter of a fifth embodiment of the present invention.

FIG. 6 illustrates in circuit diagram form an inverter of a fifth embodiment of the present invention. The inverter comprises of switch 638, PMOS transistor 639 and NMOS transistor 640. Switch 638 is coupled to the gates of PMOS transistor 639 and NMOS transistor 640. The source of PMOS transistor 639 is coupled to a first voltage potential and the drain of PMOS transistor 639 is coupled to the drain of NMOS transistor 640. The source of NMOS transistor 640 is coupled to a second voltage potential. Switch 638 has an input and applies a third voltage potential on the gates of PMOS transistor 639 and NMOS transistor 640 when the voltage potential on the input is above the threshold voltage of switch 638. Switch 638 applies a fourth voltage potential on the gates of transistors 639 and 640 when the voltage potential on the input is below the threshold voltage of switch 638. Switch 638 can be a npn transistor with a collector coupled to a first voltage potential and an emitter coupled to a second voltage potential. Switch 638 can also be a NMOS transistor with a drain coupled to a first voltage potential and a source coupled to a second voltage potential.

In either case, the third voltage potential is greater than the fourth voltage potential. In this embodiment of the present invention, the first voltage potential and the third voltage potential is five volts while the second voltage potential and fourth voltage potential is zero volts.

Switch 638 with a npn transistor or NMOS transistor maintains the voltage potential on the gates of transistors 639 and 640 at a third potential until the voltage potential on its input falls below its threshold voltage. Similarly, switch 638 maintains the voltage potential on the gates at a fourth potential until the voltage potential on its input rises above its threshold voltage. Consequently, when the voltage potential on its input varies slowly, the voltage potential on the gates of transistors 639 and 640 experiences a faster fall time from high to low potential and a faster rise time from low to high potential. The faster fall and rise times reduces the power consumption of the inverter because the faster fall and rise times reduces the transition time where both PMOS transistor 639 and NMOS transistor 640 are in the on state.

The inverter of this embodiment in the present invention can be incorporated in battery monitoring device 100, controller 101, host device 105, host timer 308 and battery timer 309.

Figure 7:
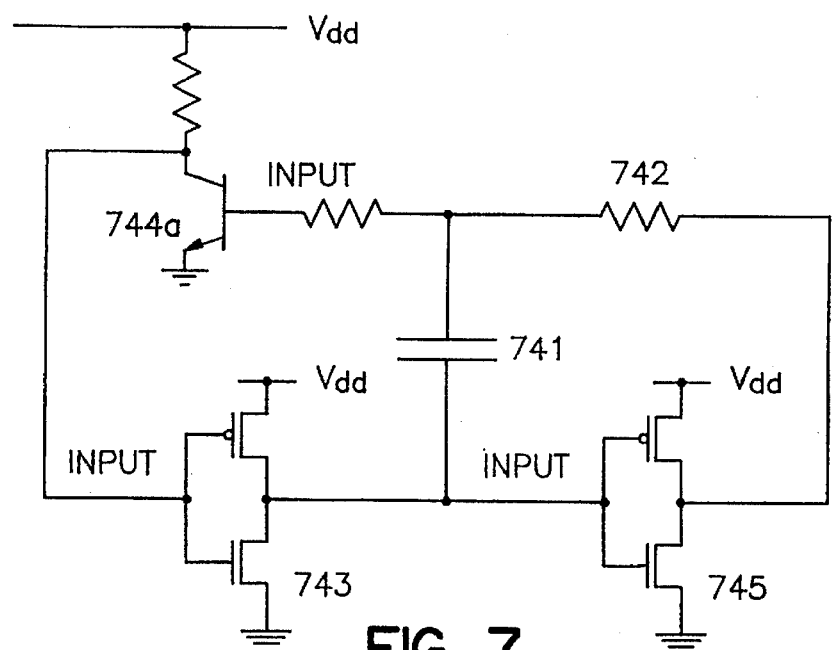
FIG. 7 illustrates in circuit diagram form an oscillator of a sixth embodiment of the present invention.

FIG. 7 illustrates in circuit diagram form an oscillator of a sixth embodiment of the present invention. The oscillator comprises of capacitor 741, resistor 742, inverter 743, switch 744a and inverter 745. Capacitor 741 stores charge in both polarities. Resistor 742 is coupled to capacitor 741 and delays discharging and charging of capacitor 741. Inverter 743 is coupled to capacitor 741 and has an input. Inverter 743 comprises of a PMOS transistor coupled to a high voltage potential and a NMOS transistor coupled to a low voltage potential. Inverter 743 applies charge to capacitor 741 when the voltage potential on the input is above the threshold voltage of the NMOS transistor. Inverter 743 removes charge from capacitor 741 when the voltage potential on the input is below the threshold voltage of the PMOS transistor. In this embodiment, the charge applied to capacitor 741 and removed from capacitor 741 is negative charge. It is to be appreciated that positive charge can also be applied and removed from capacitor 741. In this case, instead of removing charge, inverter 743 would be applying charge and instead of applying charge inverter 743 would be removing charge.

Switch 744a is threshold detection circuitry and is coupled to inverter 743 and coupled to capacitor 741. Switch 744a applies a first voltage potential on the input of inverter 743 when the voltage potential on its input is above the threshold voltage of switch 744a. Switch 744a applies a second voltage potential on the input of inverter 743 when the voltage potential on its input is below the threshold voltage of switch 744a. Switch 744a can be a npn bipolar transistor with a collector coupled to a third voltage potential and an emitter coupled to a fourth voltage potential. In this embodiment, the first voltage potential and the third voltage potential are five volts. The second voltage potential and the fourth voltage potential are zero volts. The oscillator can also include inverter 745. Inverter 745 comprises a PMOS transistor coupled to a high voltage potential and a NMOS transistor coupled to a low voltage potential. Inverter 745 removes charge from capacitor 741 when the voltage potential on its input is below the threshold voltage of its PMOS transistor. Inverter 745 applies charge to capacitor 741 when the voltage on its input is above the threshold voltage of its NMOS transistor. Like inverter 743, the charge carriers in this embodiment are negative. However, the charge carriers can also be positive. In this case, instead of removing charge, inverter 745 would be applying charge and instead of applying charge, inverter 745 would be removing charge.

Switch 744a results in decreased power consumption by the oscillator because switch 744a reduces the power consumption of inverter 743 by reducing the rise and fall times of the voltage potential on the input of inverter 743 for slowly varying voltage potentials.

In addition, the oscillator of this embodiment can be incorporated into a clock generation device.

Figure 8:
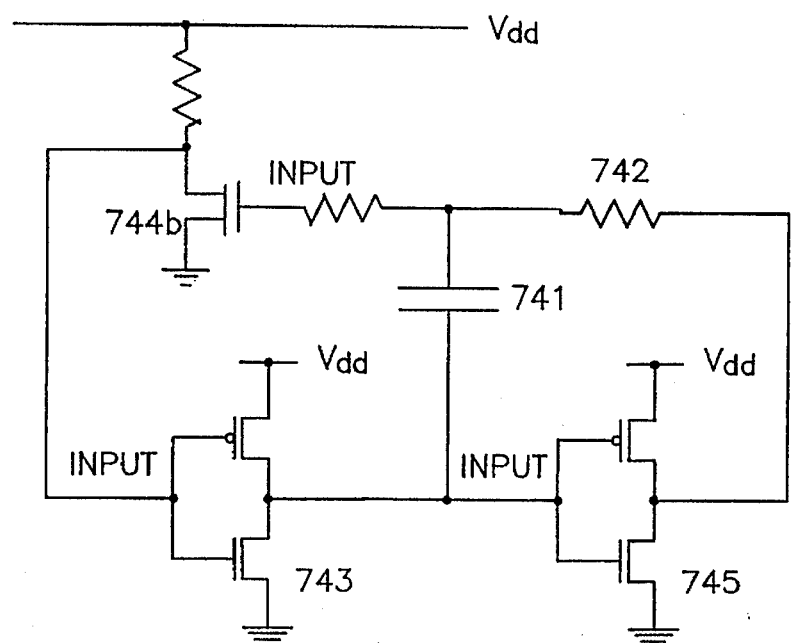
FIG. 8 illustrates in circuit diagram form an oscillator of a seventh embodiment of the present invention.

FIG. 8 illustrates in circuit diagram form an oscillator of a seventh embodiment of the present invention. In this embodiment, switch 744b is threshold detection circuitry that comprises of a NMOS transistor with a drain coupled to a third voltage potential and a source coupled to a fourth voltage potential. The gate is coupled to capacitor 741. Other elements of the oscillator are similar to the oscillator of FIG. 7. The oscillator of FIG. 8 operates in similar fashion to the oscillator of FIG. 7.

Figure 9:
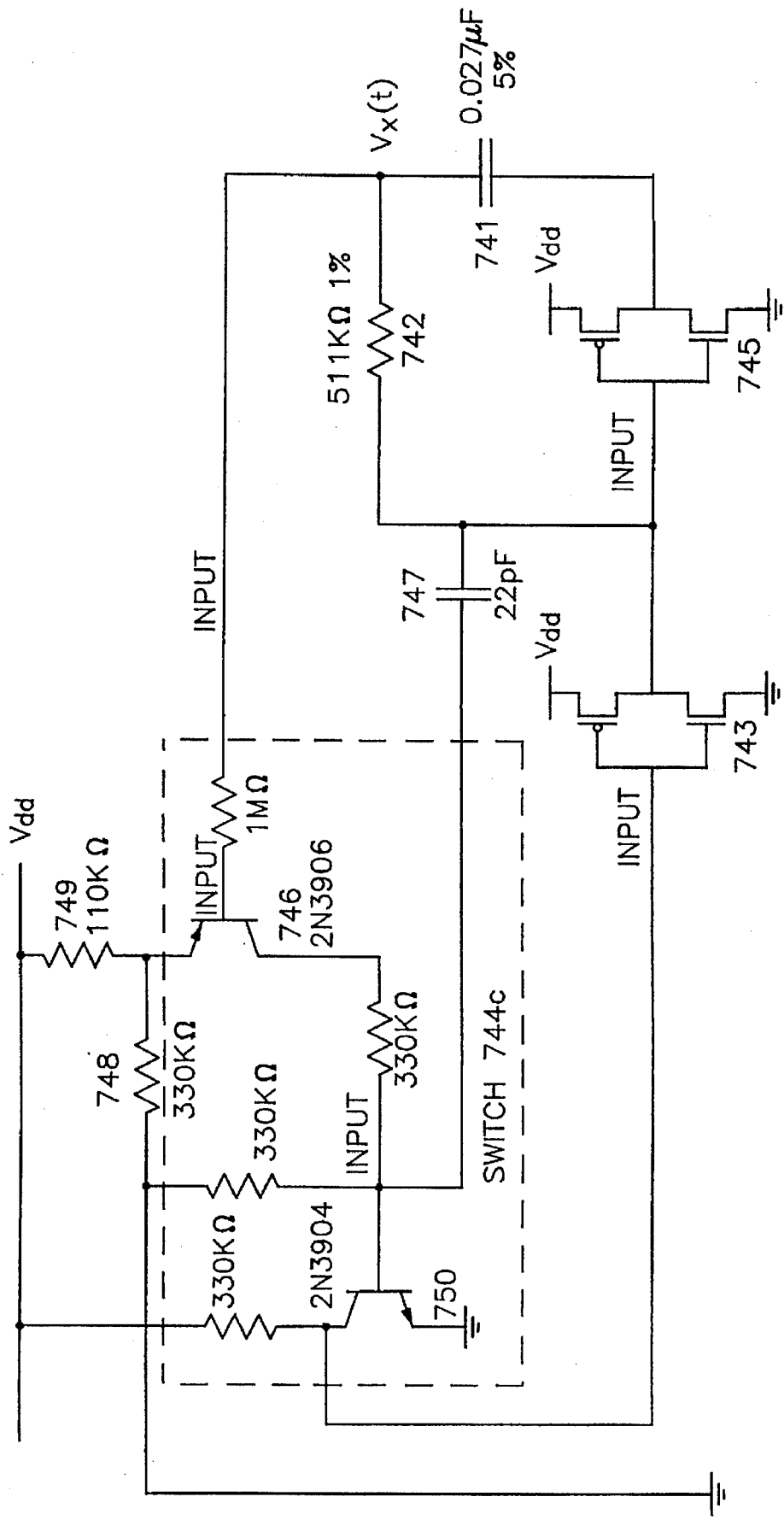
FIG. 9 illustrates in circuit diagram form an oscillator of an eighth embodiment of the present invention.

FIG. 9 illustrates in circuit diagram form an oscillator of an eighth embodiment of the present invention. The oscillator comprises of capacitor 741, resistor 742, inverter 743, switch 744c and inverter 745. Capacitor 741, resistor 742, inverter 743 and inverter 745 perform similar functions as in FIG. 7 and 8. In this embodiment, switch 744c is threshold detection circuitry that not only comprises an npn transistor 750 like npn transistor 744a as in FIG. 7, but also comprises pnp transistor 746. Pnp transistor 746 has an emitter coupled to a high voltage potential, a base coupled to capacitor 741 and a collector coupled to the base of npn transistor 750. In this configuration, pnp transistor 746 acts as an inverter. It applies a fifth voltage potential on the base of npn transistor 750 when the voltage potential on its base is above its threshold voltage and applies a sixth voltage potential on the base of npn transistor 750 when the voltage potential on its base is below its threshold voltage. In this configuration, the fifth voltage potential is less than the sixth voltage potential. Consequently, when the voltage potential on the base of pnp transistor 746 increases, the voltage potential on the base of npn transistor 750 decreases and when the voltage potential on the base of pnp transistor 746 decreases, the voltage potential on the base of npn transistor 750 increases.

The oscillator of FIG. 9 also comprises of a feedback circuit 747 coupled to the base of npn transistor 750 and coupled to inverter 743. Feedback circuit 747 provides feedback to the base of npn transistor 750. Thus, when the input of inverter 743 is transitioning between a first potential and a second potential, feedback circuit 747 causes npn transistor 750 to switch faster which in turn causes the input of inverter 743 to transition faster.

Figure 10:
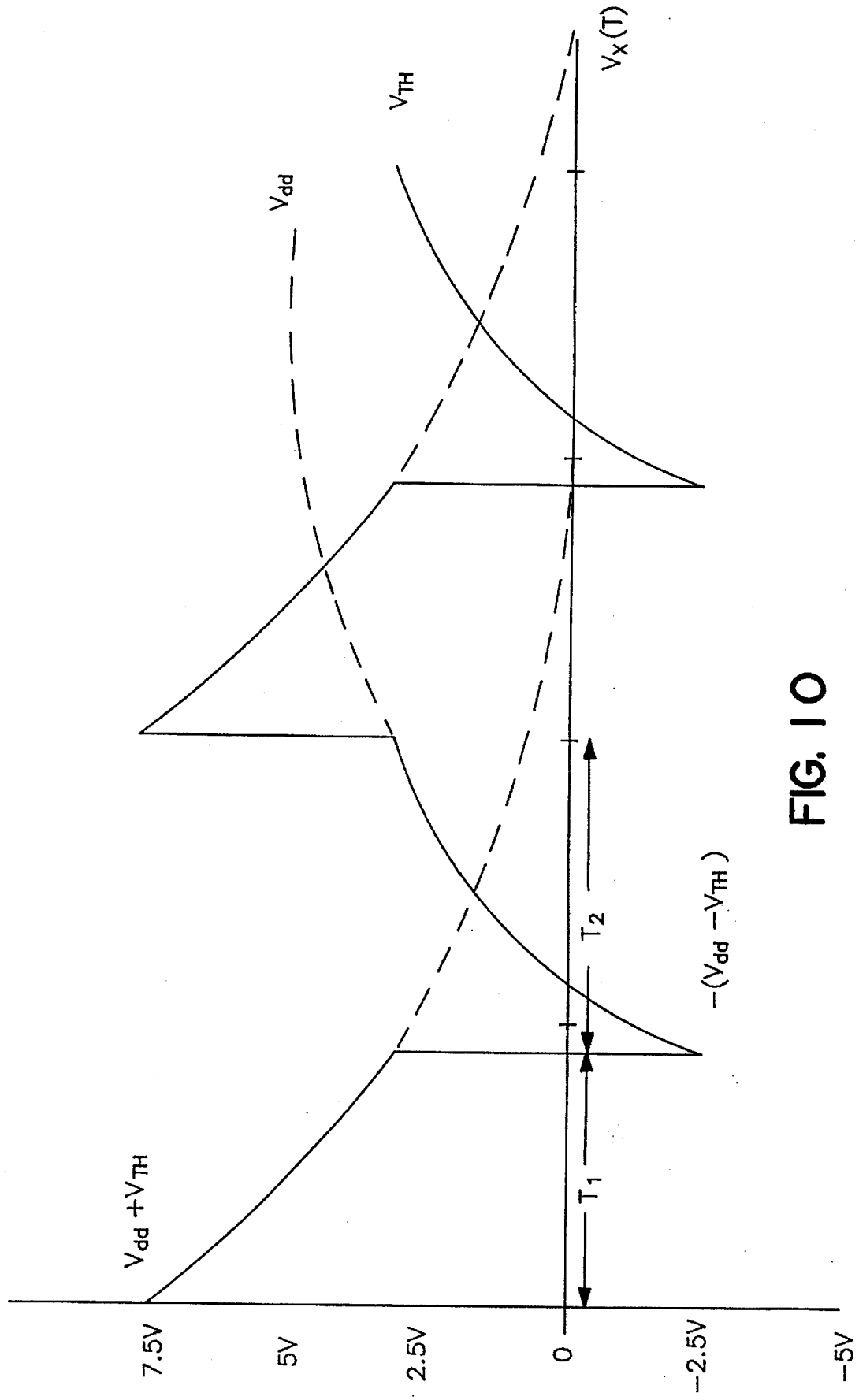
FIG. 10 illustrates in timing diagram form the operation of the oscillator of FIG. 9.

The oscillator of FIG. 9 also comprises resistor 748 and resistor 749. Resistors 748 and 749 causes the threshold voltage of switch 744c to shift. In this embodiment, resistor 748 is a 5% tolerance 330 kiloohm resistor and resistor 749 is a 5% tolerance 110 kiloohm resistor. Transistor 746 has a base-emitter voltage of 0.6–0.7 volts. With a $V_{dd}$ of 5 volts, resistors 748 and 749 acts as a voltage divider and causes the threshold voltage ($V_{TH}$) of switch 744c to shift to 3.1–3.2 volts as illustrated in FIG. 10. In this embodiment, the threshold voltage ($V_{TH}$) is approximately half of the difference between the high voltage potential ($V_{dd}$) and the low voltage potential (ground). This threshold voltage causes the rise time ($T_r$) of $V_x(t)$ to approximately equal the fall time ($T_f$) of $V_x(t)$. The nearly equal rise and fall times in turn cause the absolute value of the $V_x(t)$ slope during the rise time to be approximately the same as the fall time. When a temperature change causes a change in threshold voltage for pnp transistor 746, the threshold voltage $V_{TH}$ for switch 744c also changes because of the change in threshold voltage for transistors 746. The change in $V_{TH}$ in turn causes $T_f$ to increase if $V_{TH}$ decreases and causes $T_f$ to decrease if $V_{TH}$ increases. However, $T_r$ also decreases when $V_{TH}$ decreases and increases when $V_{TH}$ increases. In addition, with the slope characteristics as described, the decrease in $T_r$ approximately offsets the increase in $T_f$ and the increase in $T_r$ approximately offsets the decrease in $T_f$. Thus, the time period for one cycle ($T_f+T_r$) remains relatively constant for variations in temperature. As a consequence, the oscillator of this embodiment of the present invention experiences little change in frequency with change in temperature. It will be appreciated that the oscillator of this embodiment can be incorporated into a clock generator.

Alternatively, resistors 749 can be replaced with a 180 kiloohm resistor. With this resistor, the threshold voltage ($V_{TH}$) of switch 744c shifts to approximately 2.5 volts when the base-emitter voltage of transistor 746 is 0.7 volts. The time period for one cycle ($T_f+T_r$) remains relatively constant for variations in temperature and the oscillator experiences little change in frequency with change in temperature.

Figure 11:
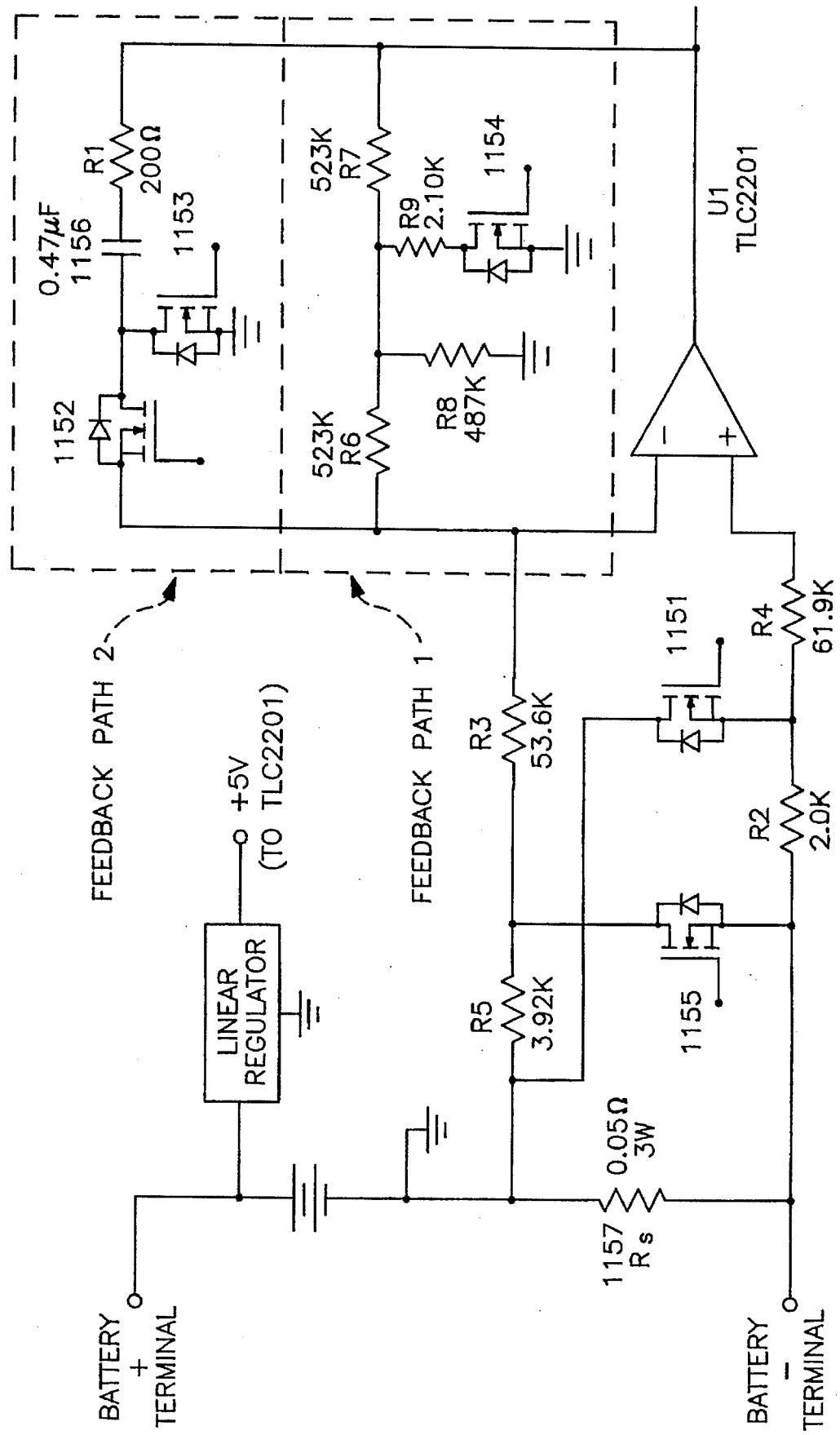
FIG. 11 illustrates in circuit diagram form a current measuring device of a ninth embodiment of the present invention.

FIG. 11 illustrates in circuit diagram form a current measuring device of a ninth embodiment of the present invention. The current measuring device comprises transistors 1151, transistor 1152, transistor 1153, transistor 1154, transistor 1155, integrating capacitor 1156 and resistor 1157. Each of transistors 1151, 1152, 1153, 1154 and 1155 may comprise type 2N7002. The current measuring device further comprises an amplifier U1 (e.g. TLC2201) having its inverting input coupled to feedback path 1, feedback path 2, and resistors R3 and R5. The non-inverting input of amplifier U1 is coupled to resistors R2 and R4. Feedback path 1 comprises transistor 1152, transistor 1151, integrating capacitor 1156 and resistor R1. Feedback path 2 comprises transistor 1154 and resistors R6, R7, R8 and R9. The current measuring device further comprises a linear regulator providing a positive five volt output which may be coupled to amplifier U1. The device measures current by passing battery current through resistor 1157 and measuring the voltage across resistor 1157. It integrates the discharge current by passing a smaller value of the current through integrating capacitor 1156 and measuring the voltage across integrating capacitor 1156. When measuring instantaneous low-rate discharge current, transistors 1151, 1152 and 1155 are turned off. Transistor 1153 and 1154 are turned on. When measuring instantaneous high-rate discharge current, transistors 1151, 1152, 1154 and 1155 are turned off. Transistor 1153 is turned on. When integrating the current, transistors 1151, 1153 and 1155 are turned off. Transistors 1152 and 1154 are turned on. When discharging integrating capacitor 1156, transistor 1151 is turned on while transistor 1155 is held in the off state. This holds the amplifier inputs to zero. At the same time, transistor 1154 is turned off to configure the feedback in the low-gain configuration. Finally, transistor 1152 is held off and transistor 1153 is turned on to provide the discharge path for capacitor 1156. The output of the amplifier discharges capacitor 1156 to ground.

Thus, a novel method and apparatus for monitoring discharge of a battery has been described.

What is claimed is:

1. A method for monitoring discharge of a battery comprising:

determining amount of battery self-discharge;

determining amount of battery discharge due to a monitoring circuit;

determining amount of battery discharge due to a host device when said host device is in a first power consumption mode; and determining amount of battery discharge due to said host device when said host device is in a second power consumption mode, said first power consumption mode causing greater discharge of said battery during a given period of time than said second power consumption mode.

2. The method of claim 1 wherein said first power consumption mode is an on state and said second power consumption mode is an off state.

3. The method of claim 1 further comprising:

determining whether said battery is coupled to said host device.

4. A method for monitoring discharge of a battery comprising:

determining amount of battery self-discharge;

determining amount of battery discharge due to a monitoring circuit;

determining amount of battery discharge due to a host device when said host device is in a first power consumption mode; and determining amount of battery discharge due to said host device when said host device is in a second power consumption mode, said first power consumption mode causing greater discharge of said battery during a given period of time than said second power consumption mode; and determining whether said battery is coupled to said host device by:

receiving an interrupt signal;

disabling a host interrupt signal line; and determining whether said interrupt signal still exists.

5. The method of claim 1 further comprising:

measuring voltage across battery terminals of said battery; and measuring temperature of said battery.

6. The method of claim 1 further comprising:

measuring current drawn by said host device.

7. The method of claim 1 wherein determining amount of battery self-discharge comprises:

calculating battery self-discharge over a specified time interval.

8. The method of claim 1 wherein determining amount of battery discharge due to said monitoring circuit comprises:

calculating battery discharge due to said monitoring circuit over a specified time interval.

9. The method of claim 1 wherein determining amount of battery discharge due to said host device when said host device is in said second power consumption mode comprises:

calculating battery discharge due to said host device over a specified time interval when said battery is coupled to said host device.

10. The method of claim 1 further comprising:

sending a first interrupt signal after a first time interval when said battery is coupled to said host device; and sending a second interrupt signal after a second time interval when said battery is decoupled from said host device.

11. The method of claim 10 wherein said first time interval is shorter than said second time interval.

12. The method of claim 10 wherein determining amount of battery self-discharge comprises:

calculating battery self-discharge over said first time interval when said battery is coupled to said host device; and calculating battery self-discharge over said second time interval when said battery is decoupled from said host device.

13. The method of claim 10 wherein determining amount of battery discharge due to said monitoring circuit comprises:

calculating battery discharge due to said monitoring circuit over said first time interval when said battery is coupled to said host device; and calculating battery discharge due to said monitoring circuit over said second time interval when said battery is decoupled from said host device.

14. The method of claim 10 wherein determining amount of battery discharge due to said host device when said host device is in said second power consumption mode comprises:

calculating battery discharge due to said host device over said first time interval when said battery is coupled to said host device.

15. The method of claim 1 further comprising:

determining amount of battery discharge due to said host device when said host device is in a third power consumption mode.

16. The method of claim 15 wherein determining amount of battery discharge due to a host device when said host device is in said third power consumption mode comprises:

measuring current drawn by said host device; and calculating battery discharge due to said host device over a specified time interval using a measured value of said current drawn across terminals of said battery.

17. The method of claim 1 further comprising:

determining whether said host device is operating is said first or second power consumption mode.

18. The method of claim 1 further comprising:

determining whether said host device has switched to a full operational mode.

19. A battery monitoring device for coupling to a battery and a host device, said battery monitoring device comprising:

a current measuring apparatus capable of measuring current drawn by said host device;

a controller coupled to said current measuring apparatus, wherein said controller capable of determining battery self-discharge, determining battery discharge due to a monitoring circuit, determining battery discharge due to a host device when said host device is in a first power consumption mode, determining battery discharge due to said host device when said host device is in a second power consumption mode, said first power consumption mode causing greater discharge of said battery during a given period of time than said second power consumption mode; and a memory device coupled to said controller and capable of storing battery data.

20. The battery monitoring device of claim 19 further comprising:

a voltage measuring apparatus capable of measuring voltage across terminals of said battery; and a temperature measuring apparatus capable of measuring temperature of said battery.

21. The battery monitoring device of claim 19 further comprising:

a timer apparatus capable of generating a signal to said controller after a specified duration when said battery is coupled to a host device.

22. The battery monitoring device of claim 21 wherein said timer apparatus further comprises:

a capacitor;

a first resistor coupled to said capacitor capable of delaying discharge of said capacitor;

a first inverter coupled to said capacitor and having a first input, wherein said first inverter capable of applying charge to said capacitor when a first voltage potential on said first input is above a first threshold voltage Of said first inverter and wherein said first inverter capable of removing charge from said capacitor when a second voltage potential on said first input is below a second threshold voltage of said first inverter; and threshold detection circuitry having a second input and a second output, said second output coupled to said first input of said first inverter and said second input coupled to said capacitor, wherein said threshold detection circuitry capable of applying said first voltage potential on said first input when a third voltage potential on said second input is below a third threshold voltage of said threshold detection circuitry, and wherein said threshold detection circuitry capable of applying said second voltage potential on said first input when a fourth voltage potential on said second input is above said third threshold voltage of said threshold detection circuitry, wherein said third threshold voltage of said threshold detection circuitry is different than said first and second threshold voltages.

23. The battery monitoring device of claim 19 further comprising:

a timer apparatus capable of generating a signal to said controller after a specified duration when said battery is decoupled from a host device.

24. The battery monitoring device of claim 19 wherein said controller further comprises:

an input capable of receiving an interrupt request signal from a host device.

25. The battery monitoring device of claim 24 wherein said controller further comprises:

a disable apparatus capable of disabling said interrupt request signal from said host device.

26. The battery monitoring device of claim 19 wherein said controller further comprises:

a reset device capable of resetting a timer apparatus.

27. The battery monitoring device of claim 19 further comprising:

a battery timer coupled to said controller and capable of transmitting a signal to said controller after a specified time interval.

28. The battery monitoring device of claim 27 wherein the controller further comprises:

an input capable of receiving said signal from said battery timer.

29. The battery monitoring device of claim 19 wherein said memory is capable of storing a value representing amount of charge remaining in said battery.

30. The battery monitoring device of claim 19 wherein said memory device capable of storing a value representing total amount of battery discharge.

31. In a system comprising a host device, a battery monitoring circuit and a battery, a method for monitoring discharge of said battery comprising:

determining whether said host device is operating in a first operating mode;

receiving an interrupt signal;

determining whether said battery is coupled to said host device;

if said battery is coupled to said host device:

determining whether said host device is operating in a second operating mode or a third operating mode;

determining battery discharge due to said host device over a first specified time interval;

determining battery discharge due to battery self-discharge over a second specified time interval; and determining battery discharge due to said monitoring circuit over a third specified time interval.

32. The method of claim 31, wherein if said battery is not coupled to said host device, said method further comprises the steps of;

determining battery discharge due to battery self-discharge over a fourth specified time interval;

determining battery discharge due to said monitoring circuit over a fifth specified time interval.

33. The method of claim 31, wherein said first, second and third specified time intervals are equivalent.

34. The method of claim 31, wherein said fourth and fifth time intervals are equivalent.

35. The method of claim 31, wherein said fourth and fifth time intervals are different than said first, second and third time intervals.

36. The method of claim 31, wherein said step of determining whether said battery is coupled to said host device further comprises:

disabling a host interrupt signal line; and determining whether said interrupt signal still exists.

37. The method of claim 31, wherein if said battery is coupled to said host device, said method further comprising the step of:

measuring a current;

comparing said current with a predetermined value; and determining whether said host device is operating in said first operating mode.

38. The method of claim 31, wherein said step of determining whether said host device is operating in said second operating mode or said third operating mode comprises:

measuring a current;

comparing said current with a predetermined value;

if said current is less than or equal to said predetermined value, said host device is operating in said second operating mode; and if said current is greater than said predetermined value, said host device is operating in said third operating mode.

* * * * *

UNITED STATES PATENT AND TRADEMARK OFFICE
CERTIFICATE OF CORRECTION

| | | |
|---|---|---|
| PATENT NO. | : | 5,640,081 |
| DATED | : | June 17, 1997 |
| INVENTOR(S) | : | Austin et al. |

It is certified that error appears in the above-identified patent and that said Letters Patent is hereby corrected as shown below:

In column 16 at line 40 delete "full" and insert --fully--

Signed and Sealed this

Twenty-first Day of October 1997

Attest:

BRUCE LEHMAN

Attesting Officer

Commissioner of Patents and Trademarks